United States Patent [19]

Chaparro et al.

[11] Patent Number: 4,925,089
[45] Date of Patent: May 15, 1990

[54] ENVIRONMENTAL RESPONSE CONTROL APPARATUS AND METHOD

[75] Inventors: John J. Chaparro, San Diego; Dirk De Kreek, Thousand Oaks; Charles R. Holdaway, San Diego, all of Calif.

[73] Assignee: JC Systems, Inc., San Diego, Calif.

[21] Appl. No.: 374,525

[22] Filed: Jun. 30, 1989

[51] Int. Cl.$^5$ .............................................. F24F 5/00
[52] U.S. Cl. ........................... 236/78 D; 236/15 BB; 73/865.6
[58] Field of Search ........... 236/15 BB, 15 BG, 46 R, 236/46 A, 46 C, 46 D, 46 E, 47, 78 B, 78 D, 91 A; 73/865.6; 62/208, 209; 219/492, 516

[56] References Cited

U.S. PATENT DOCUMENTS

| | | | |
|---|---|---|---|
| H193 | 1/1987 | Bitner et al. | 236/15 BB |
| H229 | 3/1987 | Phillips | 73/865.6 |
| 3,625,421 | 12/1971 | Garrison | 236/15 BB |
| 3,633,094 | 1/1972 | Clements | 323/18 |
| 3,792,366 | 2/1974 | Jornod | 330/22 |
| 3,866,135 | 2/1975 | Clements | 330/51 |
| 3,933,197 | 1/1976 | Zimmer et al. | 165/2 |
| 3,952,945 | 4/1976 | Biddulph | 236/46 R |
| 3,984,699 | 10/1976 | Bailey | 307/41 |
| 4,264,035 | 4/1981 | Maxson et al. | 236/87 |
| 4,429,829 | 2/1984 | Dutton | 236/78 B |

FOREIGN PATENT DOCUMENTS 0184441 8/1986 Japan ................................. 73/865.6

OTHER PUBLICATIONS

Micristar Catalog for Research, Inc., Box 24064, Minneapolis, Minnesota, 1985, pp. 1-12.
Barber Colman Catalog, Barber-Coman Company, Industrial Instruments Division, 1700 Rock Street, Rockford, Ill., pp. 1-12.

Primary Examiner—Harry B. Tanner
Attorney, Agent, or Firm—Baker, Maxham, Jester & Meador

[57] ABSTRACT

A control apparatus for controlling the temperature of an environmental chamber within which a device is tested for thermal characteristics employs a pair of control elements connected in cascade. The first element produces a required air temperature in response to a desired temperature and to the temperature of the device; the second produces a temperature set point in response to the required and actual air temperatures. Possible stress on the device is avoided by limiting the range of required air temperature. Response is accelerated by a pass-through circuit, parallel to the first element, which responds to a change in the desired temperature by adding to the required air temperature of value proportional to the change.

11 Claims, 3 Drawing Sheets

ENVIRONMENTAL RESPONSE CONTROL APPARATUS AND METHOD

BACKGROUND OF THE INVENTION

The invention is in the field of environmental control, and particularly concerns an apparatus and a method for accelerating the reaction of an environmental test system to the environmental response of a device under test in the system.

In the process control field, a system for performing an industrial process (the controlled system) gives forth its desired product in response to automatic means (the control system) which dynamically correct process parameter values of the controlled system in a manner which makes the result of the process fall within a predetermined range of values.

Control systems employ a technique called "cascading". In this regard, a control system can include more than one compensating unit which responds to the current values of a first set of process parameters by producing an operating signal. In a cascaded control system, the operating point signal of one control unit is provided as one input to another compensating unit.

Conventionally, cascade control has been applied to control relatively "slow" primary physical processes through secondary control of "faster" processes. For example, in a heat exchanger system, steam is introduced into a heat-exchanger to provide a source of thermal energy for heating a reagent. The slow process of heating the reagent is controlled in a primary unit by manipulation of the heat exchange process in response to the present heat of the reagent and the desired heat. The primary unit produces a thermal change value. The value of the available heat parameter (steam flow) is controlled in a secondary compensation unit having a fast reaction to the thermal change value and steam heat. The secondary unit produces a signal which quickly controls the flow of steam.

A well-known industrial process is embodied in an environmental chamber which is used to test a device ("device under test" or "DUT"). The industrial process to be controlled is one or more environmental effects produced by the chamber. For example, the thermal response of a device is evaluated in an environmental chamber having means for establishing the temperature of its interior and for changing that temperature at a selected rate to another temperature. The temperature of the DUT changes in response to the change in environmental chamber temperature at a rate determined by physical characteristics of the device. The temperature responses of the device and the environmental chamber are both relatively slow industrial processes. Furthermore, the thermal characteristics of the device will vary under varying test conditions of pressure, humidity, and temperature. Last, control of the chamber temperature as a secondary variable in a cascade control system can lead to high, and possibly fatal, thermal stress on the device under test.

SUMMARY OF THE INVENTION

The invention employs accelerating control of the environmental response of a test chamber by reacting to the difference between the temperature ($PV_1$) of a device under test to a prescribed setpoint temperature ($SP_1$), enabling the test chamber to respond quickly to changes in $SP_1$ without subjecting the device to unacceptable levels of thermal stress.

The invention achieves this important objective by cascading a primary controller operating on the difference between $PV_1$ and $SP_1$ with a secondary controller operating on the difference between the output of the primary controller and the temperature of the environmental chamber in which the device under test is located. In this manner, the thermal response of the device under test to changes in chamber temperature as indicated by the primary controller can be used to control the chamber temperature through the secondary controller.

This basic complement of components permits cascade control of two relatively "slow" thermal processes and, therefore, achieves the objective of controlling environmental chamber temperature in response to the varying thermal characteristics of a device under test and the second goal of avoiding unacceptable thermal stress of the device.

These and other objections and advantages of this invention will be evident when the following disclosure is read with reference to the below-described drawings.

DETAILED DESCRIPTION OF THE PREFERRED EMBODIMENT

There is great difficulty in characterizing the response of an environmental chamber prior to its use in testing devices. Prequalification of such a chamber involves extensive and lengthy procedures to accurately establish its thermal, pressure, and humidity responses of to setpoint values. In this regard, setpoint values are electrical signal representations of the profiles of desired environmental conditions within the chamber. For example, a thermal setpoint signal can represent a chamber temperature profile beginning at an initial temperature, changing at a first rate in degrees per minute to a second temperature, staying at the second temperature for a period of time and then changing to a third temperature at a second rate.

An environmental chamber exhibits a definite response to a setpoint signal; characterization or prequalification of the chamber illustrates the chamber's response. Such characterization is required in order to account for the thermal response of the device under test. The setpoint profile represents the desired temperature profile of the device under test; however, the complex thermal response of the device under test and the environmental chamber must be accounted for. The characterization step determines this complex response with the device in the chamber, and provides the basis for changing the setpoint signal profile to one which, when used to control the temperature in the chamber, will cause the device under test to exhibit the desired profile.

The invention eliminates the requirement for characterization by provision of a cascaded primary and secondary controller in which the primary controller generates an operating point signal in response to the setpoint profile and the temperature of the device under test. This first operating point value is then provided as a setpoint temperature value to a secondary controller which compares it to the actual temperature in the environmental chamber and generates a second operating point signal provided to the heating and cooling controls of the environmental chamber.

Figure 1:
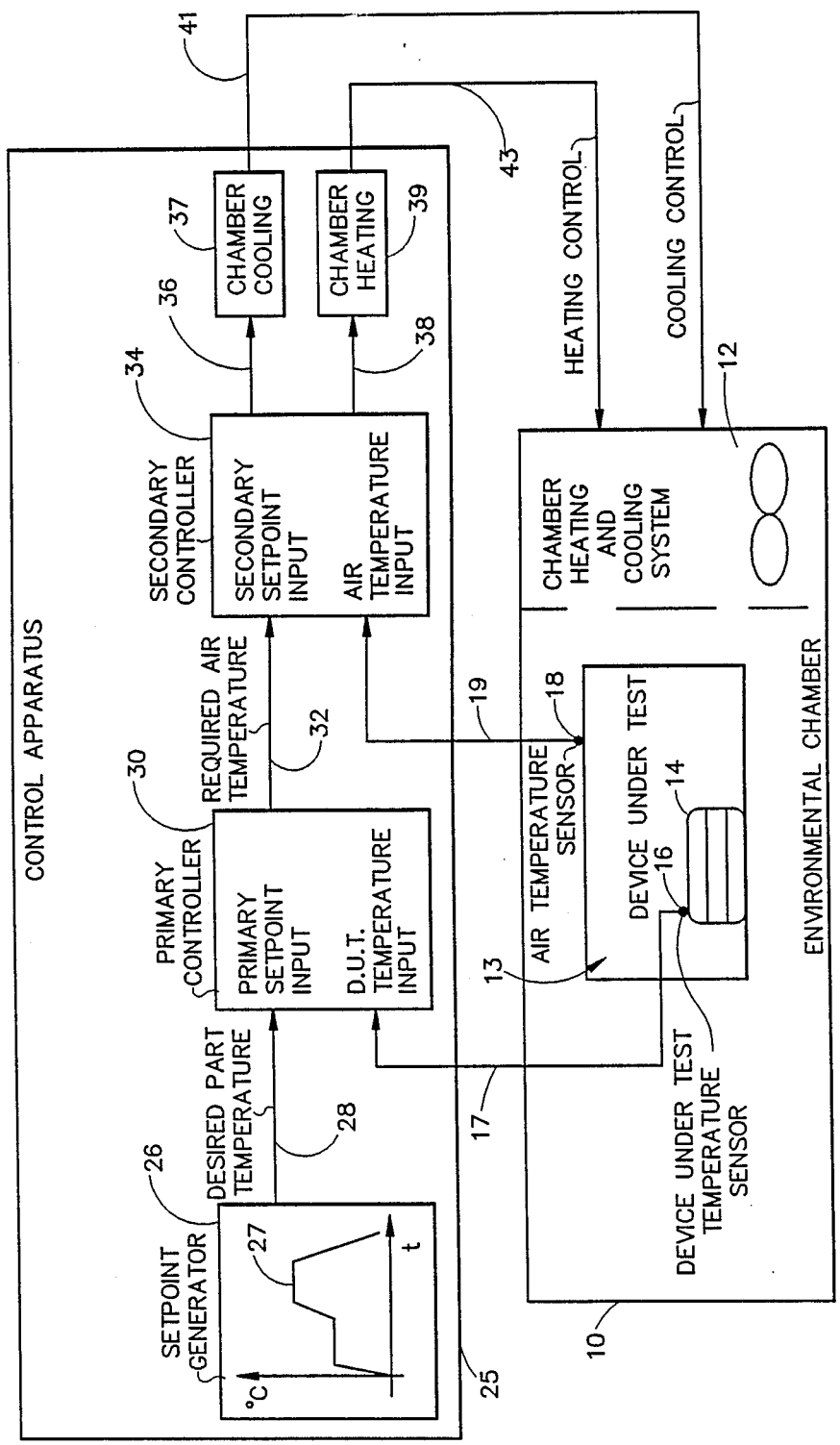
FIG. 1 is an illustration of the environmental response control apparatus of the invention in combination with an environmental chamber containing a device under test.

FIG. 1 illustrates the invention in its intended environment of application. The invention is intended to be used with an environmental chamber 10. The chamber 10 may be of the conventional type, and includes a system 12 for heating and cooling the air temperature within a test space 13. The test space 13 contains a device 14, referred to as the device under test, whose response to a dynamic thermal environment is to be evaluated. In the invention, the response of the device under test is indicated directly by its temperature. This response is sensed by the temperature sensor 16, which is attached to, or embedded in, the device, and which can comprise a conventional thermocouple. The sensor 16 produces an electrical signal having a magnitude proportional to the temperature of the device 14. The signal representing the temperature of the device under test is provided on a signal line 17. The parameter directly affecting the temperature of the device under test is the temperature of the air provided by the chamber heating and cooling system 12. The temperature of the air is sensed by a conventional temperature sensor 18 which provides an electrical signal on line 19, the signal having a magnitude proportional to the temperature of the air.

THE INVENTION

The control apparatus of the invention is indicated by reference numeral 25. The control apparatus includes a setpoint generator 26 which generates a setpoint signal corresponding to a desired thermal profile for the device under test. The profile is indicated by the waveform 27 which presents a thermal profile in units of degrees centigrade per time. The setpoint generator 26 produces an electrical signal corresponding to the thermal profile 27. The electrical signal is referred to as a setpoint signal and is provided as a desired part temperature signal on signal 28.

The control apparatus includes a primary controller 30 which responds to the setpoint temperature signal on signal line 28 and the signal representing the actual temperature of the device 14, provided on signal line 17, to produce a first operating point signal corresponding to the value of the air temperature in the test space 13 required to produce the desired part temperature indicated by the setpoint signal. The first operating point signal is provided on signal line 32.

A secondary controller 34 receives the first operating point signal and the signal representing the actual temperature of the air in the test space 13. These two signals are combined by the secondary controller to produce either a cooling signal on signal line 36 or a heating signal on signal line 38. If the temperature requires cooling, the cooling signal on signal line 36 represents the amount of cooling necessary to achieve the required air temperature; similarly, if heating is required, the magnitude of the signal on signal line 38 corresponds to the amount of heating necessary to achieve the required temperature.

The control apparatus 25 of FIG. 1 can be implemented either as a set of discrete hardware components, or as a process executing in real time in a programmed processor. In either case, the inventor contemplates that conversion of signals rendered in digital form on signal lines 36 and 38 will be required. Thus, digital to analog converters 37 and 39 are provided to convert the signals produced by the secondary control 34. Analog signals would, therefore, be provided on signal lines 41 and 43 to operate the heating and cooling system 12.

Figure 2:
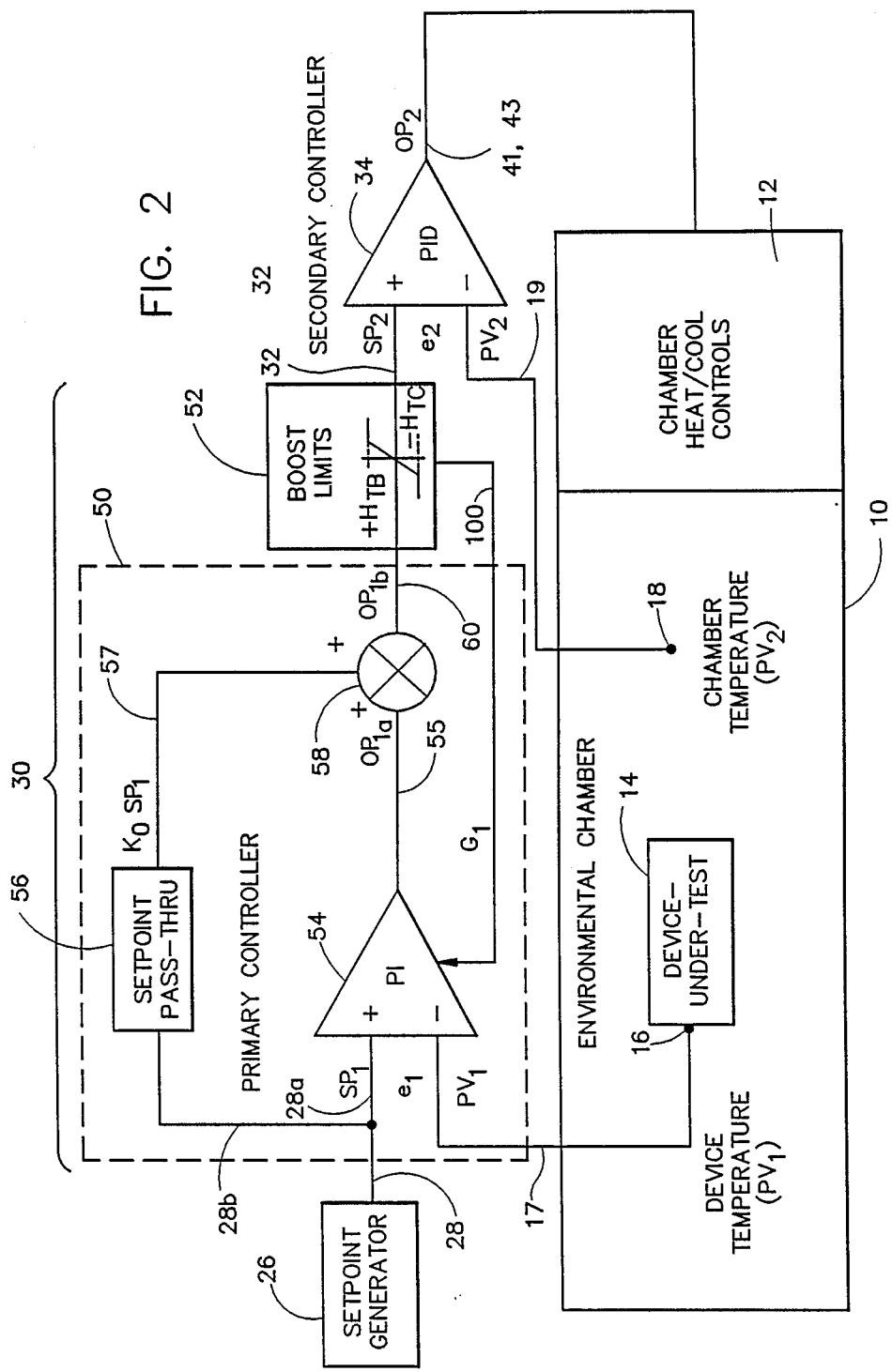
FIG. 2 is a more detailed illustration of the apparatus of the invention.

The invention is illustrated, in its hardware aspect, by conventional control system representation in FIG. 2. Parts which FIG. 2 has in common with FIG. 1 are illustrated by identical reference numerals. In FIG. 2, the setpoint generator 26 can comprise any of a variety of available waveform generators. The setpoint generator is connected by signal line 28 to the primary controller 30. As FIG. 2 illustrates, the primary controller 30 includes a proportional, integrating (PI) control element 54 which receives the setpoint signal (SP$_1$) on signal line 28a and the device temperature signal PV$_1$ on signal line 17. The control element 54 operates to develop a deviation signal e$_1$ by subtracting the device temperature signal from the setpoint signal, and operates conventionally to produce an operating point set signal (OP$_{1a}$) on signal line 55. The primary controller 30 further includes a setpoint pass-through circuit 56 which receives the setpoint signal SP$_1$ on signal line 28b and produces a set point proportional signal (k$_0$SP$_1$) on signal line 57. Signal lines 55 and 57 feed a conventional summing junction element 58 which adds the magnitude of the operating point set and proportional signals to produce a first operating point signal OP$_{1b}$ on signal line 60.

The primary controller 30 also includes a boost limit circuit 52 which receives the first operating point signal OP$_{1b}$ on signal line 60. The boost limit circuit 52 operates conventionally to limit the absolute value of the negative and positive magnitude of the first operating point signal to a value H$_{TB}$. In this regard, when the magnitude of the first operating point signal at the summing point junction 58 exceeds the absolute value of H$_{TB}$, the signal output by the boost limit circuit has its magnitude limited to the absolute value of H$_{TB}$. Between the positive and negative magnitude limits, boost limit circuit 52 provides the first operating point signal unchanged on signal line 32.

The first operating point signal processed by the boost limit circuit 52 is provided as a second setpoint signal (SP$_2$) to the secondary controller 34. Preferrably, the secondary controller 34 is a proportional, integrating-differentiating control unit which generates a second operating point signal (OP$_2$) in response to a deviation signal having a value equal to the difference between the chamber temperature signal PV$_2$ on signal line 19 and the second setpoint signal SP$_2$ on signal line 32.

For an understanding of the functions of the elements of FIG. 2 in controlling the operation of the control apparatus 10 of FIG. 1, the following theoretical description is provided. The primary controller 30 of the apparatus of the invention includes a proportional-integral (PI) control unit 54 operating on the deviation value e$_1$ resulting from comparison of PV$_1$ with SP$_1$. It provides an operating point set signal OP$_{1a}$ according to equation (1), wherein:

$$OP_{1a} = k_1 e_1 + (k_1/t_{i1}) \int e_1 dt + C_1 \qquad (1)$$

In equation 1, the first term $k_1e_1$, represents a proportionality term. The second term includes an integral term with an appended constant $C_1$. In the second term, the parameter $t_{i1}$ represents a time interval over which the deviation value is integrated, and the constant $C_1$ is the usual constant which attends integration.

Under conventional cascade control, one would expect the signal $OP_{1a}$ to be applied directly to the secondary controller as $SP_2$. However, in the control strategy of this invention, two significant modifications to this convention are made.

The first modification to convention is the pass-through of the first setpoint signal $SP_1$ by way of $28b$, 56, and 57. The pass-through is summed with the output of the control unit 54, $OP_{1A}$ in the summing junction 58 according to equation (2), wherein:

$$OP_{1b} = OP_{1a} + k_0 SP_1 \quad (2)$$

In equation (2), the value $k_0$ is a constant; $k_0 SP_1$ is the signal value generated by the pass-through circuit. At equilibrium, that is, when $PV_1 = SP_1$, and $SP_1$ is unchanging, the first setpoint signal $OP_{1b}$ is a constant represented by $C_0$ in equation (3), wherein:

$$OP_{1b} = C_1 + k_0 SP_1 = C_0 \quad (3)$$

Preferably, the control tuning constants for the primary controller's control unit 54 are established such that the proportional gain value, $k_1$, is low and the integral time constant, $t_i$, is short. Thus, when there is a change in the setpoint signal ($\delta SP_1$) the instantaneous response to the change can be approximated by equation (4), wherein:

$$OP_{1b} = C_0 + k_0(\delta SP_1) \quad (4)$$

Thus, the input $SP_2$ to the secondary controller is, in effect, directly proportional to the setpoint for the device under test ($SP_1$). This value is modified, as described by equations (2)-(4) by the action of the primary controller 30.

The second major modification to convention is found in the action of the boost limit circuit 52. For purposes of this description, the action of the primary controller 30 on the secondary controller setpoint $SP_2$ is referred to as the "boost" level. The boost value has the effect of enhancing the chamber temperature response to the deviation el between the new setpoint ($SP_1$) and the device-under-test temperature ($PV_1$). Critical to the operation of the invention is the containment of the boost value range within prescribed limits. Without such limits, the temperature of the chamber could be driven to a level that might subject the device under test to excessive levels of thermal stress, or to thermal overshoot or undershoot during system stabilization. Relatedly, when the action of the primary controller causes the value of $OP_{1b}$ to exceed a boost limit, the value of $SP_2$ is constrained according to equations (5) and (6), wherein:

IF $OP_{1b} > SP_1 + H_{TB}$, THEN $SP_2 = SP_1 + H_{TB}$ (5)

IF $OP_{1b} < SP_1 - H_{TC}$, THEN $SP_2 = SP_1 - H_{TC}$ (6)

Otherwise, $SP_2 = OP_{1b}$ (7)

Where $H_{TB}$ represents a maximum allowable increase in chamber temperature, and $H_{TC}$ represents a maximum allowable decrease in chamber temperature.

Figure 3:
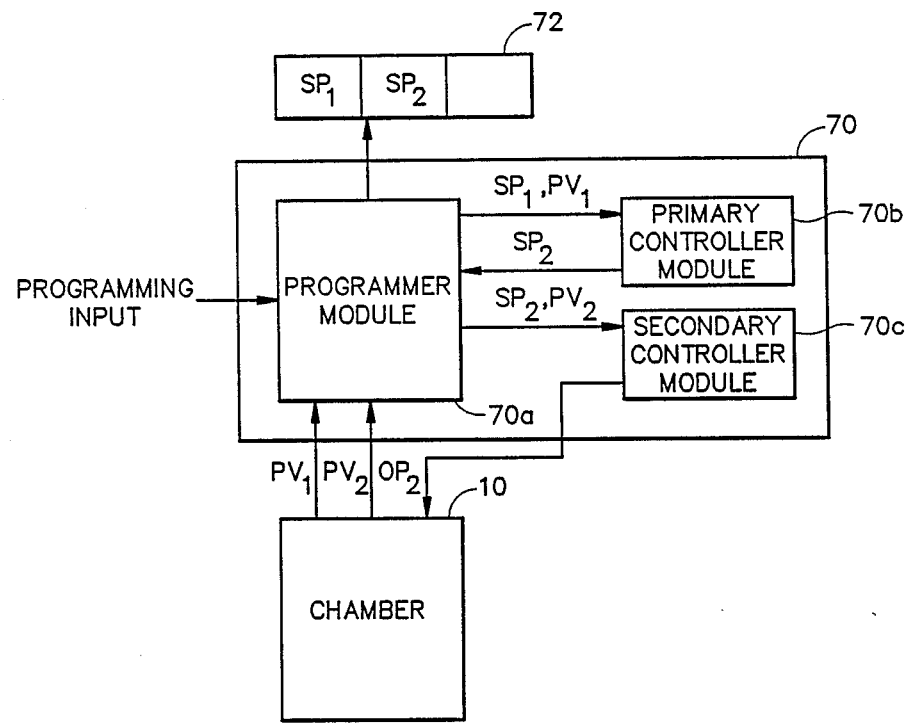
FIG. 3 illustrates a programmable circuit for executing the environmental response control procedure implemented by the invention.

The method of the invention is practiced in a programmable circuit illustrated in FIG. 3. The programmable circuit is indicated by reference numeral 70 in FIG. 3 and can include, for example, a conventional available microprocessor system with CPU, memory, and associated I/O components. The programmable circuit 70 receives the PV1 and PV2 signals from the chamber 10. The signals can be provided in continuous form from the chamber 10 and converted in the circuit 70 by appropriate conventional procedures. Alternatively, the signals can be provided in digital form by the chamber 10 from appropriate conventionally-available sensors. The OP2 signal is provided by the circuit 70 to the chamber 10 in appropriate continuous or digital form.

The programmable circuit 70 includes three program modules. The first is a programmer module 70a, which acts as the primary signal interface between the programmable circuits 70 and the chamber 10. This module also provides intracircuit interface between a primary controller module 70b and secondary controller module 70c. The programmer module 70a also provides outputs appropriate to drive a visual display 72 for displaying the signals $SP_1$, $SP_2$, and $OP_2$.

The modules of the programmable circuits 70 are represented in appended Tables I-III. The modules are given in conventional pseudocode format, it being asserted that the reasonably skilled circuit programmer will be able to derive product-specific, assembly-level implementations from these tables without undue experimentation.

Table I defines the essential data objects upon which the modules 70a-70c operate in executing the method of the invention. In this regard, lines 0101-0112 define specific data objects input to, and output from, the programmable circuits 70, and also signals generated internally by the modules 70b and 70c.

The procedure steps executed by the primary controller are steps 0200-0217 in Table I. In the procedure executed by the primary controller 70b, all registers are initially reset and normal operation is begun by reading the $SP_1$ signal from the programmer module 70a. The actual device temperature $PV_1$ is also obtained from the programmer module 70a and stored. Next, in step 0204, the primary controller calculates the deviation signal $e_1$. The deviation signal is first integrated in step 0205 and added to the value stored in an offset register CF. In step 0206, an effective setpoint value is calculated by adding the contents of the CF register to the current value of $SP_1$. In step 0206, the constant $k_1$ is equal to 1.0. Next, in step 0207, a second deviation signal is calculated by the primary controller by subtracting the actual device temperature from the effective set point value. The second deviation value is multiplied by the proportional gain term $G_1$ of the primary controller and is stored as a signal value OUTPUT 1. Steps 0209-0210 perform boost limitation by comparison against the values of $H_{TB}$ and $H_{TC}$. The setpoint for the secondary controller is obtained in steps 0211-0213, which imposes a second boost limitation by, first, adding $SP_1$ to the OUTPUT 1 value obtained in steps 0209-0210, and flagging the resulting value as $SP_2$. The value for $SP_2$ is constrained to lie in the range [MAXTEMP, MINTEMP]. The constrained value of $SP_2$ is provided to the secondary controller as its setpoint in step 0214, and the primary controller procedure is looped through step 0215.

Table II gives the pseudocode description of the secondary controller, which is initialized in steps 0300 and 0310. The value $SP_2$ is read into the procedure in step 0311, and the chamber temperature $PV_2$ is obtained in steps 0312. The second deviation signal is produced in step 0313 by subtracting $PV_2$ from $SP_2$. In step 0314, a conventional PID (proportional-integrating-differentiating) control equation is applied to the second deviation signal and stored as $OP_2$. In steps 0315, the second operating point signal $OP_2$ is provided to the chamber by way of the programmer module. The secondary controller procedure is looped through step 0316.

As the annotation preceding the programmer module of Table III illustrates, the programmer, in addition to serving as the primary external interface, can also provide message transfer service from the primary to secondary controller. Table III illustrates the programmer in the latter capacity.

The programmer module, illustrated in Table III, initializes in steps 0400 and 0401 and provides the setpoint $SP_1$ to the primary controller in step 0402. The programmer module then provides a signal to the display 72 for visual output of the $SP_1$ value sent to the primary controller. Next, the second setpoint $SP_2$ is obtained from the primary controller and sent to the secondary controller in steps 0404 and 0405. Then $SP_2$ is displayed in step 0406. The output of the secondary controller, the second operating point signal, $OP_2$ is provided from the secondary controller, to the chamber, and displayed in steps 0407-0409. The programmer module procedure loops through step 0410.

TABLE I

DEFINITIONS AND PRIMARY CONTROLLER

| | |
|---|---|
| 0100 | Definitions: |
| 0101 | SP1 = System Setpoint (from programmer) |
| 0102 | PV1 = Device Temperature |
| 0103 | G1 = Proportional Gain of Primary Controller |
| 0104 | SP2 = Secondary Controller Setpoint (from primary controller) |
| 0105 | PV2 = Chamber Air Temperature |
| 0106 | $H_{TB}$ = Heat Thermo Boost (the maximum allowable chamber temperature above the setpoint) |
| 0107 | $H_{TC}$ = Cool Thermo Boost (the most negatie temperature differential between the chamber temperature and the setpoint) |
| 0108 | MAXTEMP = Maximum Allowable Temperature for the Chamber Setpoint |
| 0109 | MINTEMP = Lowest Allowable Temperature for the Chamber Setpoint |
| 0110 | DEV1 = Deviation between SP1 and PU1 |
| 0111 | DEV2 = Deviation between SP2 and PU2 |
| 0112 | OP2 = Operating Point for Chamber |
| 0200 | Reset All Registers |
| 0201 | Start Normal Operation: |
| 0202 | Read Desired Setpoint (SP1) from Programmer and Store in Memory as SP1 |
| 0203 | Read Actual Device Temperature (PV1) and Store in Memory as PV1 |
| 0204 | Subtract PV1 from SP1 and Store as DEV1 |
| 0205 | Integrate DEV1 as a Function of Time and Add its Value to the Value Stored in Offset Register (CF) |
| 0206 | Add SP1 to CF and Store as ESP1 (effective setpoint #1) |
| 0207 | Subtract PV1 from ESP1 and Store as DEV2 |
| 0208 | Multiply DEV2 by the Proportional Gain Term G1 and Store as Output 1 |
| 0209 | If Output 1 is Positive then the System Needs Heating and the Following Occurs: If the magnitude of output1 is greater than the magnitude of $H_{TB}$, then set the magnitude of output1 equal to the magnitude |

TABLE I-continued

DEFINITIONS AND PRIMARY CONTROLLER

| | |
|---|---|
| | of $H_{TB}$ and store as output1. |
| 0210 | If Output1 is Negative, then the system needs cooling and the following occurs: If the magnitude of output1 is greater than the magnitude of $H_{TC}$, then set the magnitude of output1 equal to the magnitude of $H_{TC}$ and store as output1. |
| 0211 | Add SP1 to output1 and store as SP2 |
| 0212 | If SP2 is greater than MAXTEMP, then set SP2 equal to MAXTEMP and store as SP2 |
| 0213 | If SP2 is less than MINTEMP, then set SP2 equal to MINTEMP and store as SP2. |
| 0214 | Send SP2 to secondary controller as its setpoint |
| 0215 | Jump back to "Start Normal Operation 0201" and repeat endlessly |

TABLE II

SECONDARY CONTROLLER

| | |
|---|---|
| 0300 | Reset all registers |
| 0310 | Start normal operation |
| 0311 | Read SP2 from programmer and store in memory |
| 0312 | Read chamber temperature (PV2) and store in memory |
| 0313 | Subtract PV2 from SP2 and store as DEV2 |
| 0314 | Apply PID control equation to DEV2 and store result as OP2 |
| 0315 | Send OP2 to chamber |
| 0316 | Jump back to start normal operation 0310 and repeat endlessly |

In the system, the output of the primary controller is the setpoint for the secondary controller (the chamber air temperature controller). It can be connected directly or provided via the programmer, which serves as a communications device between the primary and secondary controllers. This is in addition to the normal programmer function of generating a setpoint for the two channels.

TABLE III

PROGRAMMER

| | |
|---|---|
| 0400 | Reset all registers on startup |
| 0401 | Normal operation: |
| 0402 | Send the setpoint to the primary controller as SP1 |
| 0403 | Display SP1 |
| 0404 | Read the output of the primary controller as SP2 and store in memory |
| 0405 | Send SP2 to secondary controller |
| 0406 | Display SP2 |
| 0407 | Jump back to "normal operation 0406" and repeat endlessly |

It is contemplated by the inventors that an additional feature of an operable embodiment would be in disabling the integral term of equation (1) whenever $SP_2$ is constrained according to equation (5) or (6). The term would be disabled for so long as the constraint applies. The objective is to mitigate the effects of reset wind-up. Signal line 100 in FIG. 2 illustrates the concept.

In FIG. 2, whenever the boost limit circuit constrains $SP_2$, a signal is provided on signal line 100, which disables the integral mechanism in the unit 54, and which sets a value for $C_1$, the integral constant. When $SP_2$ is constrained, the value for $C_1$ is given by:

$$C_1 = SP_2 - (k_1 e_1 + k_0 SP_1) \qquad (8)$$

When $C_1$ is determined by equation (8), $SP_2$ is adjusted off of the boost value when:

$$SP_1 - H_{TC} \leq (k_1 e_1 + C_1 + k_0 SP_1) \leq SP_1 + H_{TB} \quad (9)$$

The conditions of equations (8) and (9) are intended generally to apply to the analog embodiment of FIG. 2 in the form of a diode clipper, for example.

While I have described a preferred embodiment of my invention, it should be understood that modifications and adapations thereof will occur to persons skilled in the art. Therefore, the protection afforded my invention should only be limited in accordance with the scope of the following claims.

I claim:

1. In an environmental test system in which a device under test is contained in an environmental chamber, said environmental chamber including means responsive to a chamber control signal for setting an environmental condition within said chamber, and signal means in said chamber for providing a first signal indicative of the reaction of said device under test to said environmental condition and a second signal indicative of said condition, a control apparatus for generating said chamber control signal, said apparatus comprising:

setpoint means for generating a test condition waveform;

a first control means connected to said setpoint means and to said chamber for generating a first operating point signal in response to said first signal and to said test condition signal;

limit means connected to said first control means and responsive to the magnitude of said first operating point signal for limiting said first operating point signal to a constant magnitude value when said magnitude exceeds a particular limit; and a second control means connected to said limit means and to said chamber for generating said chamber control signal in response to said second signal and to said first operating point signal.

2. The apparatus of claim 1, wherein said first control means includes:

a proportional-integrating controller having a first input connected to said setpoint means and a second input connected to said device under test, said proportional integrating controller for generating an operating point set signal in response to the difference between said first signal and said setpoint signal;

pass-through means connected to said setpoint means for providing a summing signal proportional to said setpoint signal; and summing means connected to said pass-through means and to said proportional-integrating controller for combining said operating point set signal and said summing signal to produce said first operating point signal.

3. The apparatus of claim 1, wherein said first control means includes a proportional-integrating controller means for generating said first operating point signal by combining an integral of the difference between said first signal and said test condition signal with a proportional value obtained by multiplication of said difference with a constant value.

4. An environmental test system controller for controlling an environmental test chamber temperature in response to the temperature of a device under test in an environmental test chamber, said controller comprising:

a setpoint generator;

a primary controller connected to said setpoint generator and to said device for generating an operating point set signal;

a pass-through circuit connected to said setpoint generator for providing a summing signal;

summing means connected to said primary controller and to said pass-through circuit for combining said operating pointset signal and said summing signal to produce an operating point signal;

a limiting circuit connected to said summing means for limiting said operating point signal to a range between a maximum temperature signal and a minimum temperature signal; and a secondary controller connected to said limiting circuit and to said environmental test chamber for generating a chamber temperature signal indicative of a temperature to be produced in said environmental test chamber, said secondary controller generating said chamber temperature signal in response to an operating point signal in said range and to the temperature in said environmental test chamber.

5. The controller of claim 4, wherein said setpoint generator produces a device temperature setpoint signal $SP_1$ and said environmental test chamber provides a device temperature signal $PV_2$, said primary controller including a proportional integrating controller connected to said setpoint generator and to said environmental test chamber for generating said operating point set signal as:

$$OP_{1a} = k_1 e_1 + (k_1/t_{i1}) \int e_1 dt,$$

where:
$OP_{1a}$ = said operating point set signal
$k_1$ = a constant
$e_1 = f(PV_1, SP1)$
$t_{i1}$ = an integral time period.

6. The controller of claim 5, wherein said pass-through circuit provides said summing signal as $k_0 SP_1$, wherein $k_0$ is a constant.

7. The controller of claim 6, wherein said summing means provides said operating point signal as:

$$OP_{1b} = OP_{1a} + k_0 SP_1$$

wherein $OP_{1b}$ is said operating point signal.

8. The controller of claim 7, wherein said limiting circuit provides said operating point signal in the form of a second setpoint signal, $SP_{21}$ where:

If $OP_{1b} > SP_1 + H_{TB}$, then $SP_2 = SP_1 + H_{TB}$, or

If $OP_{1b} < SP_1 - H_{TC}$, then $SP_2 = SP_1 - H_{TC}$,

Otherwise, $SP_2 = OP_{1b}$; and $H_{TB}$ is a limit signal representing a maximum amount by which the temperature of said environmental test chamber is permitted to increase, and $H_{TC}$ is a limit signal representing a maximum amount by which the temperature of said environmental chamber is permitted to decrease.

9. The controller of claim 8, wherein said secondary controller is a proportional-integrating-differentiating controller which generates said chamber temperature signal in response to a difference signal, $e_2$, wherein:

$$e_2 = f(SP_2, PV_2); \text{ and}$$

$PV_2$ is the present chamber temperature in said environmental test chamber.

10. In a system for subjecting a device under test to an environmental condition in an environmental chamber, a method for controlling said environmental condition, including the steps of:

measuring the magnitude of a characteristic of said environmental condition to produce a signal $PV_2$;

measuring an effect produced by said environmental condition upon said device to produce a signal $PV_1$;

providing a setpoint signal $SP_1$ to represent a desired effect to be produced upon said device by said environmental condition;

producing a first operating point representation $OP_1$ of said characteristic in response to $SP_1$ and $PV_1$;

limiting the value of $OP_1$ to a second setpoint value $SP_2$ contained in a predetermined value range representing a range of values of said environmental characteristic within which said device is subjected to allowed environmental stress;

producing a second operating point signal $OP_2$ in response to a difference between $SP_2$ and $PV_2$, said second operating point signal representing a change in the value of said characteristic; and changing the magnitude value of said environmental characteristic in response to $OP_2$.

11. The method of claim 10, wherein said step of providing $OP_1$ includes:

forming a difference signal $e_1$ by combining $SP_1$ and $PV_1$;

developing a set signal by subjecting $e_1$ to a proportional-integration function;

providing a summing signal $k_0SP_1$, where $k_0$ is a constant; and producing $OP_1$ by arithmetically combining said set signal with $k_0SP_1$.

* * * * *

UNITED STATES PATENT AND TRADEMARK OFFICE
CERTIFICATE OF CORRECTION

PATENT NO. : 4,925,089

DATED : May 15, 1990

INVENTOR(S) : Chaparro et al

It is certified that error appears in the above-identified patent and that said Letters Patent is hereby corrected as shown below:

Col. 9, line 30, please change "signal" to --waveform--;
Col. 10, line 26, please change "$PV_2$" to --$PV_1$--;
   line 50, please change "$SP_{21}$" to --$SP_2$--; and
Col. 11, line 20 and Col. 12, line 7, please delete "environmental".

Signed and Sealed this

Seventeenth Day of September, 1991

Attest:

HARRY F. MANBECK, JR.

*Attesting Officer*  *Commissioner of Patents and Trademarks*